US007250806B2

(12) United States Patent
Zhang

(10) Patent No.: US 7,250,806 B2
(45) Date of Patent: Jul. 31, 2007

(54) APPARATUS AND METHOD FOR GENERATING AN OUTPUT SIGNAL THAT TRACKS THE TEMPERATURE COEFFICIENT OF A LIGHT SOURCE

(75) Inventor: Bin Zhang, Loveland, CO (US)

(73) Assignee: Avago Technologies ECBU IP (Singapore) Pte. Ltd., Singapore (SG)

(*) Notice: Subject to any disclaimer, the term of this patent is extended or adjusted under 35 U.S.C. 154(b) by 183 days.

(21) Appl. No.: 11/070,951

(22) Filed: Mar. 2, 2005

(65) Prior Publication Data

US 2006/0197452 A1 Sep. 7, 2006

(51) Int. Cl.
*H01L 35/00* (2006.01)

(52) U.S. Cl. .......................... 327/513; 327/83; 327/93; 327/100; 398/192; 398/208; 315/112; 315/149; 315/291

(58) Field of Classification Search ................. 327/83, 327/88–90, 93, 96, 100, 538, 512–514; 372/29.014, 372/29.015, 38.02, 38.07; 341/119, 135, 341/144, 155; 323/313, 315; 250/214 R, 250/214 AL; 315/112, 118, 149, 151, 291; 398/189, 192, 207–210
See application file for complete search history.

(56) References Cited

U.S. PATENT DOCUMENTS

| | | | | |
|---|---|---|---|---|
| 4,195,234 | A | 3/1980 | Berman | |
| 4,375,037 | A | 2/1983 | Ikushima | |
| 5,198,701 | A * | 3/1993 | Davies et al. | 327/513 |
| 5,347,224 | A | 9/1994 | Brokaw | |
| 5,761,230 | A * | 6/1998 | Oono et al. | 372/38.01 |
| 5,828,329 | A | 10/1998 | Burns | |
| 6,181,191 | B1 * | 1/2001 | Paschal | 327/513 |
| 6,265,857 | B1 | 7/2001 | Demsky et al. | |
| 6,441,558 | B1 * | 8/2002 | Muthu et al. | 315/149 |
| 6,507,238 | B1 * | 1/2003 | Yang | 327/540 |
| 6,907,202 | B1 * | 6/2005 | Ide et al. | 398/208 |
| 7,068,362 | B2 * | 6/2006 | Murdock et al. | 356/226 |
| 2005/0195872 | A1 | 9/2005 | Moran | |
| 2005/0285017 | A1 * | 12/2005 | Tan et al. | 250/214 R |

FOREIGN PATENT DOCUMENTS

| | | |
|---|---|---|
| EP | 0 051 343 A3 | 5/1982 |
| JP | 57-141160 | 9/1982 |
| JP | 59-202731 | 11/1984 |

OTHER PUBLICATIONS

UK Search Report dated Aug. 1, 2006 involving counterpart UK application No. GB0604033.1

* cited by examiner

*Primary Examiner*—Haissa Philogene

(57) ABSTRACT

An apparatus and method for generating an output signal that tracks the temperature coefficient of a light source are provided. A light source temperature coefficient tracking mechanism (e.g., a current source circuit) that generates an output signal, which tracks the temperature coefficient of the light source (e.g., temperature coefficient of a light emitting diode (LED)) is provided. A proportional to absolute temperature current source circuit (PTAT current source circuit) generates a first signal. A complimentary to absolute temperature current source circuit (CTAT current source circuit) generates a second signal. The output signal that tracks the temperature coefficient of the light source is based on the first signal and the second signal.

13 Claims, 6 Drawing Sheets

TEMPERATURE TRACKING CURRENT SOURCE 150

APPARATUS AND METHOD FOR GENERATING AN OUTPUT SIGNAL THAT TRACKS THE TEMPERATURE COEFFICIENT OF A LIGHT SOURCE

BACKGROUND OF THE INVENTION

Optocoupler systems include a first circuit and a second circuit that are electrically isolated from each other. The first circuit includes a light emitting diode (LED) that is coupled to a LED current source. The first circuit is optically coupled to a second circuit. The second circuit includes a photodiode (PD). For example, the LED emits light, which impinges on the photodiode, causing a current through the photodiode (e.g., a photodiode current). The second circuit also includes a transimpedance amplifier circuit is coupled to the photodiode to generate an output voltage signal that is based on the photodiode current. The second circuit also includes a current source that generates a reference current. Typically, the photodiode current is compared with the reference signal, and this comparison is utilized to generate the output voltage signal.

Although the reference current is typically not dependent on temperature (i.e., relatively constant across temperature differences), the photodiode current changes or varies with respect to temperature. This temperature dependence causes the following unwanted and undesirable traits or attributes to the output voltage signal: 1) pulse width variation at different temperatures, and 2) pulse width distortion across temperature.

FIG. 6 illustrates several waveforms that represent various signals generated by a prior art optocoupler system, where the pulse width of the output voltage signals varies across different temperatures. It is noted that a first waveform 610 represents a reference current that is relatively fixed across temperatures.

A first waveform 620, a second waveform 630, and a third waveform 630 represent a photodiode current at different temperatures (e.g., cold temperature, room temperature, and hot temperature). An exemplary temperature range is from −40 degrees Celsius to +125 degrees Celsius. For example, the second waveform 620 represents the photodiode current signal at cold temperature (e.g., −40 degrees Celsius). The third waveform 630 represents the photodiode current signal at room temperature. The fourth waveform 640 represents the photodiode current signal at hot temperature (e.g., +125 degrees Celsius).

A fifth waveform 650, a sixth waveform 660, and a seventh waveform 670 represent output voltage signals generated by the prior art opto-coupler system at different operating temperatures. For example, the fifth waveform 650 represents the output voltage signal at room temperature. The sixth waveform 660 represents the output voltage signal at cold temperature (e.g., −40 degrees Celsius). The seventh waveform 670 represents the output voltage signal at hot temperature (e.g., +125 degrees Celsius).

As can be appreciated, the pulse width of each of the output voltage signal waveforms 650, 660, 670 is different and dependent upon temperature. It is noted that the propagation delay from off-state to on-state and on-state to off-state can be different due to asymmetric triggering at cold temperature and at hot temperature. The different propagation delays further causes pulse width distortion across the entire temperature range.

Based on the foregoing, there remains a need for an apparatus and method for generating an output signal that tracks the temperature coefficient of a light source that overcomes the disadvantages set forth previously.

SUMMARY OF THE INVENTION

An apparatus and method for tracking the temperature coefficient of a light source are described. A light source temperature coefficient tracking mechanism (e.g., a current source circuit) that generates an output signal, which tracks the temperature coefficient of the light source (e.g., temperature coefficient of a light emitting diode (LED)) is provided. A proportional to absolute temperature current source circuit (PTAT current source circuit) generates a first signal. A complimentary to absolute temperature current source circuit (CTAT current source circuit) generates a second signal. The first signal and the second signal are utilized to generate the output signal that tracks the temperature coefficient of the light source.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

An apparatus and method for generating an output signal that tracks the temperature coefficient of a light source are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Optocoupler System 100

Figure 1:
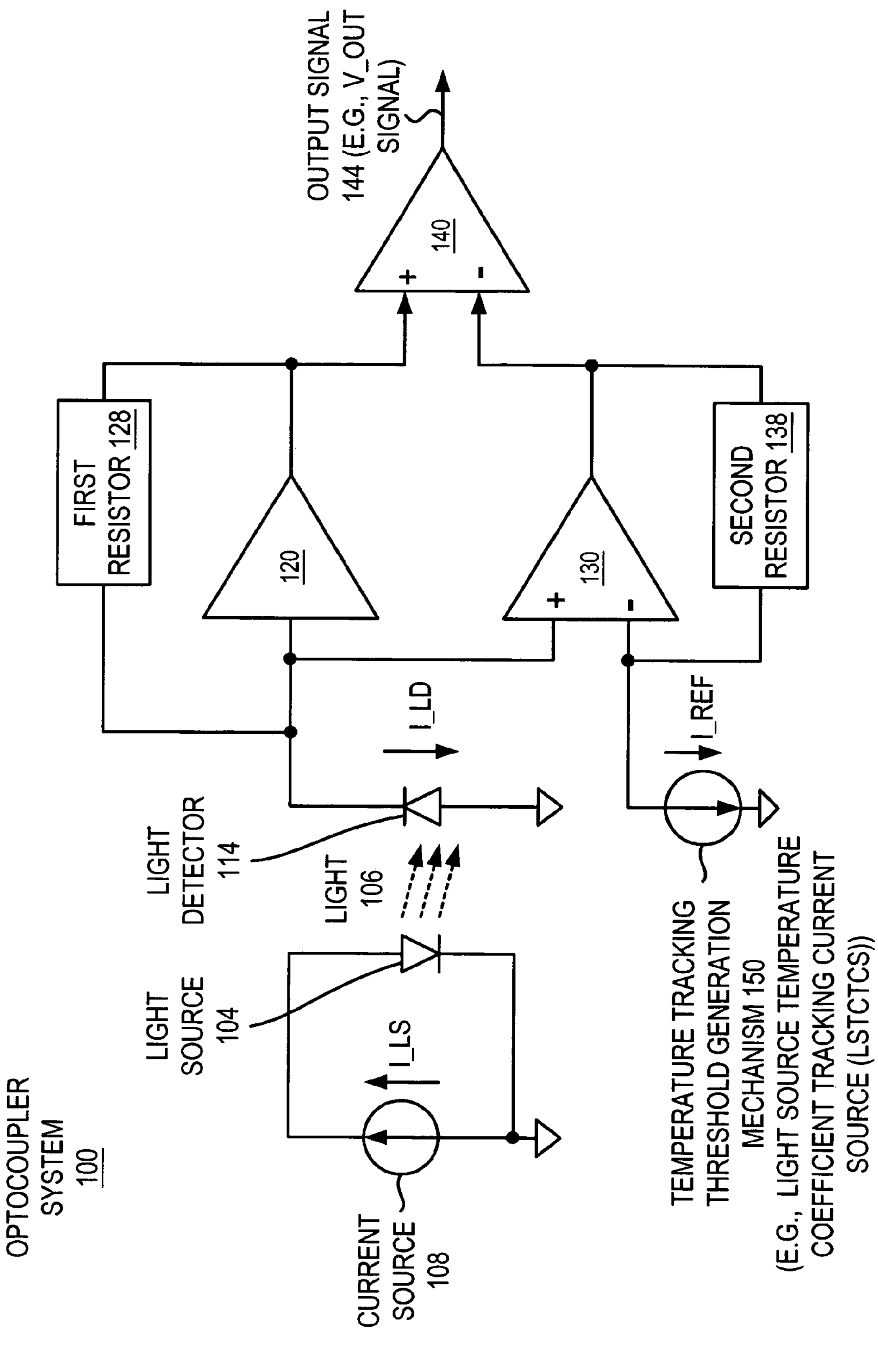
FIG. 1 illustrates an optocoupler system that includes the temperature tracking threshold signal generation mechanism according to one embodiment of the invention.

FIG. 1 illustrates an optocoupler system 100 that includes the temperature tracking threshold signal generation mechanism 150 according to one embodiment of the invention. The optocoupler system 100 includes a light source 104 (e.g., a light emitting diode, laser, or other light source) and a current source 108 that generates a current (e.g., I_light-source or I_LS) for driving the light source. In one embodiment, the light source 104 is a light emitting diode (LED), and the current source 108 generates a current for driving the LED (i.e., I_LED).

It is noted that the light source 104 and corresponding current source 108 is isolated (e.g., electrically isolated) from the remainder of the system 100, which is described in greater detail hereinafter. The two sides are coupled through light 106. Signal information is communicated from the light source 104 to a light detector 114 through light 106.

The light source 104 generates light 106 with a predetermined light output power (LOP). A current transfer ratio (CTR) is the ratio between the light source current (I_LS) and the light detector (I_LD) current. The relationship between I_LS and I_LD may be expressed as follows: I_LD=I_LS*CTR. In one embodiment, the CTR is the ratio between the LED current (I_LED) and the photo detector current (I_PD). In this case, the above expression becomes: I_PD=I_LED*CTR.

Consider the case, where I_LED is fixed. The CTR has a negative temperature coefficient (tempco) and changes with respect to temperature, thereby causing I_PD to vary or change with respect to temperature. In this case, I_PD decreases as temperature increases. Without the temperature tracking threshold signal generation mechanism 150 according to the invention, I_PD is compared to a reference signal or threshold signal that is constant with respect to temperature, which leads to a distorted output signal (e.g., a V_out signal with a rising edge and falling edge with different slopes). In one embodiment, the temperature tracking threshold signal generation mechanism generates an I_ref that is about 50% of I_PD across different temperatures so that the V_out signal has very little distortion and a relatively constant pulse width.

The optocoupler system 100 further includes a light detector 114 (e.g., a photo-detector or photodiode). The optocoupler system 100 also includes an output that generates either a logic high signal (e.g., a logic "1" signal) or a logic low signal (e.g., a logic "0" signal) depending on the state of the light source. When the LED is in the on-state, the output signal is asserted (e.g., a logic high, "1"). Similarly, when the LED is in the off-state, the output signal is de-asserted (e.g., a logic low, "0").

The light output of the light source (e.g., LED) typically has a large negative temperature coefficient that may be in a range of values, such as between about 3000 ppm/degrees Celsius and about 4000 ppm/degrees Celsius. In this regard, the LED switching threshold current (I_LS) has a similar variation across temperature when a fixed or preset photo detector switching threshold signal (I_ref_constant) is provided.

One aspect of good optocoupler system design is to maintain signal integrity (e.g., similar pulse widths, duty cycle, other signal characteristics, etc.) between the current utilized to drive the light source (I_LS) and the output current of the system (e.g., V_out). The optocoupler system 100 utilizes the temperature tracking threshold signal generation mechanism 150 to maintain the signal integrity between the current utilized to drive the light source (I_LS) and the output current of the system (e.g., V_out). For example, when the light source current has a 50 nanosecond pulse width, the optocoupler system 100 generates an output signal (V_out) that has a pulse width that is substantially similar (e.g., about 50 nanosecond). Similarly, when the light source current has a 10 nanosecond pulse width or a 100 nanosecond pulse width, the optocoupler system 100 generates an output signal (V_out) that has a pulse width that is substantially similar to about 10 nanoseconds and 100 nanoseconds, respectively.

The optocoupler system 100 also includes a comparison circuit that compares a reference signal (e.g., I_ref) to the photo detector signal (e.g., I_LD or I_PD). According to one embodiment, the comparison circuit includes first amplifier 120, a second amplifier 130, and a third amplifier 140. The first amplifier 120 includes an input electrode 122 and an output electrode 124. A first resistor (R1) 128 includes a first terminal that is coupled to the input electrode 122 and a second terminal that is coupled to the output electrode 124. The light detector 114 has a first terminal coupled to the input electrode 122 of the first amplifier and a second terminal coupled to a first predetermined power signal (e.g., a ground power signal).

The second amplifier 130 includes a first input electrode 132 (e.g., a positive terminal or non-inverting input), a second input electrode 134 (e.g., a negative terminal or inverting input), and an output electrode 136. A second resistor (R2) 138 includes a first terminal that is coupled to the second input electrode 134 and a second terminal that is coupled to the output electrode 136.

According to one embodiment of the present invention, the optocoupler system 100 includes a temperature tracking threshold signal generation mechanism 150 to reduce turn-on threshold signal variation due to changes in temperature. In one embodiment, the temperature tracking threshold signal generation mechanism 150 is implemented with a light source temperature coefficient tracking current source (LSTCTCS) that has a first electrode coupled to the second input electrode 134 of the second amplifier 130 and a second terminal coupled to the first predetermined power signal (e.g., a ground power signal).

In one embodiment, the LSTCTCS 150 reduces the turn-on threshold signal variation due to changes in temperature. For example, the LSTCTCS 150 enables the transimpedance amplifier to generate an output signal (e.g., an output voltage signal) that maintains the signal integrity of the light source current by employing a mechanism that provides a threshold signal that tracks the temperature coefficient of the light source. The temperature tracking threshold signal generation mechanism 150 is described in greater detail hereinafter with reference to FIGS. 2 and 3.

The third amplifier 140 includes a first input electrode 142 (e.g., a positive terminal or non-inverting input), a second input electrode 144 (e.g., a negative terminal or inverting input), and an output electrode 146. The first input electrode 142 is coupled to the output electrode 124 of the first amplifier 120, and the second input electrode 144 is coupled to the output electrode 136 of the second amplifier 130.

Temperature Tracking Threshold Signal Generation Mechanism 150

Figure 2:
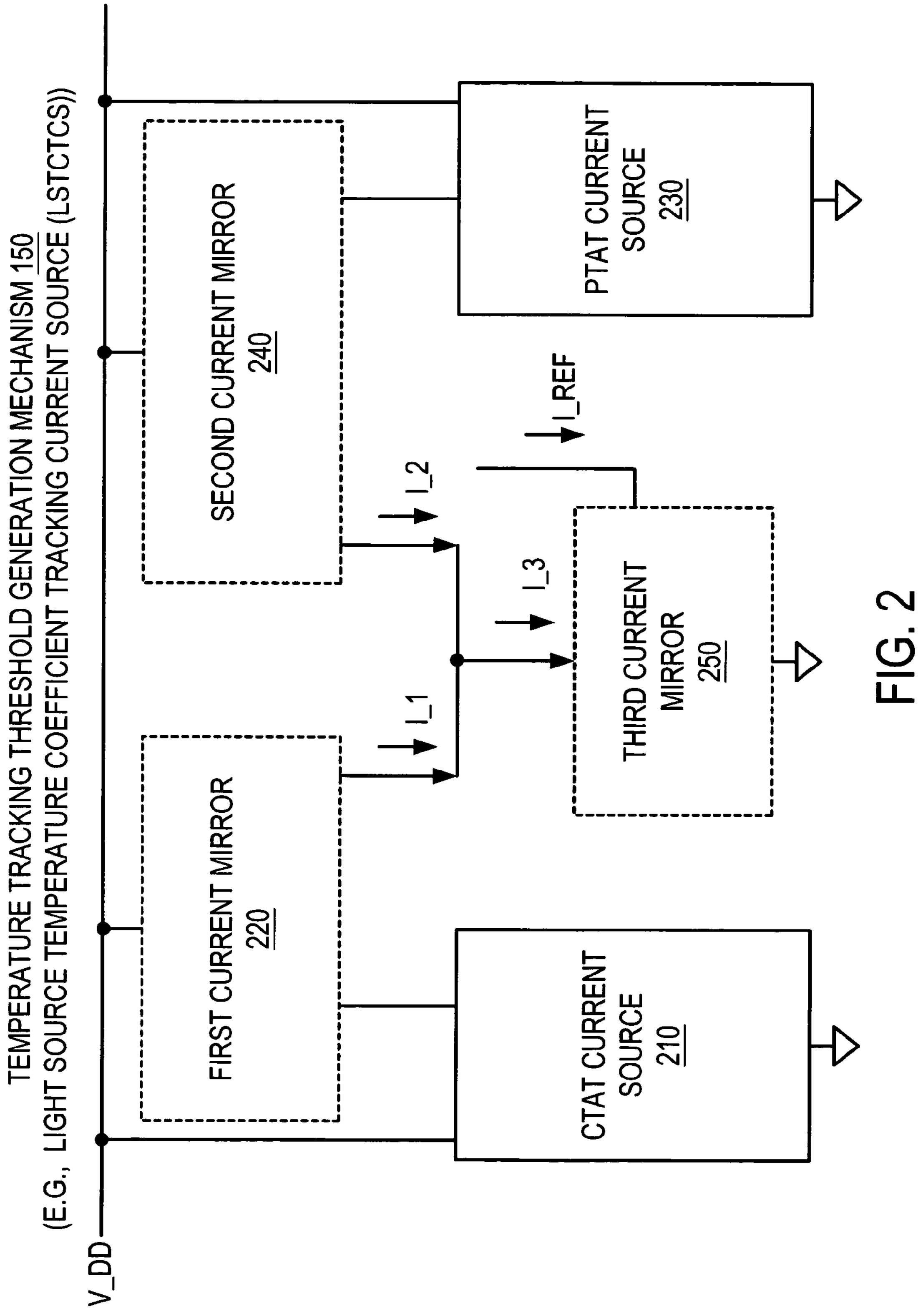
FIG. 2 is a block diagram illustrating in greater detail the temperature tracking threshold signal generation mechanism of FIG. 1 according to one embodiment of the invention.

FIG. 2 is a block diagram illustrating in greater detail the temperature tracking threshold signal generation mechanism 150 of FIG. 1 according to one embodiment of the invention. According to one embodiment, the temperature tracking threshold signal generation mechanism 150 tracks the temperature coefficient of a light source (e.g., temperature coefficient of a light emitting diode (LED)) and is implemented with a light source temperature coefficient tracking current source.

The temperature tracking threshold signal generation mechanism (e.g., light source temperature coefficient tracking current source) includes a complimentary to absolute temperature current source 210 that generates a first signal (e.g., a current signal, I1) that is complimentary (i.e., inversely proportional) to absolute temperature and a proportional to absolute temperature current source 230 that generates a second signal (e.g., a second current signal, I2) that is proportional to absolute temperature. The complimentary to absolute temperature current source 210 is also referred to herein as "CTAT current source." The proportional to absolute temperature current source 230 is also referred to herein as "PTAT current source."

A first current mirror circuit 220 is optionally provided that mirrors the current generated by the CTAT current source 210 to provide the first signal (e.g., I1). Similarly, a second current mirror circuit 240 is optionally coupled to the PTAT current source 230 and mirrors the current generated by the PTAT current source 230 to provide the second signal (e.g., I2). A third current mirror circuit 250 is optionally coupled to the first current mirror 220 and the second current mirror 240 to receive the first signal (e.g., I1) and the second signal (e.g., I2) and to mirror 13 to provide a reference signal (e.g., a reference current signal, I_ref). It is noted that current 13 is the sum of currents I1 and I2.

The CTAT current source 210, first current mirror 220, PTAT current source 230, second current mirror 240, and third current mirror 250 and exemplary circuit implementations thereof are described in greater detail hereinafter with reference to FIG. 3.

According to one embodiment of the invention, the temperature tracking threshold signal generation mechanism introduces a temperature coefficient for the threshold signal (e.g., reference current, I_ref) to match the LOP temperature coefficient of the light source (e.g., LED) so that the equivalent light source (e.g., LED) current threshold is maintained across a temperature range (e.g., temperature variations). Stated differently, the temperature tracking threshold signal generation mechanism allows the light source threshold current (e.g., I_LS) to be set around the mid range of the amplitude, thereby resulting in a symmetric turn-on delay and turn-off delay (e.g., turn-on propagation delay and turn-off propagation delay). Consequently, the signal integrity of the output signal (e.g., V_out) is maintained and signal distortion (e.g., pulse width distortion) is minimized or reduced.

Exemplary Circuit Implementation

Figure 3:
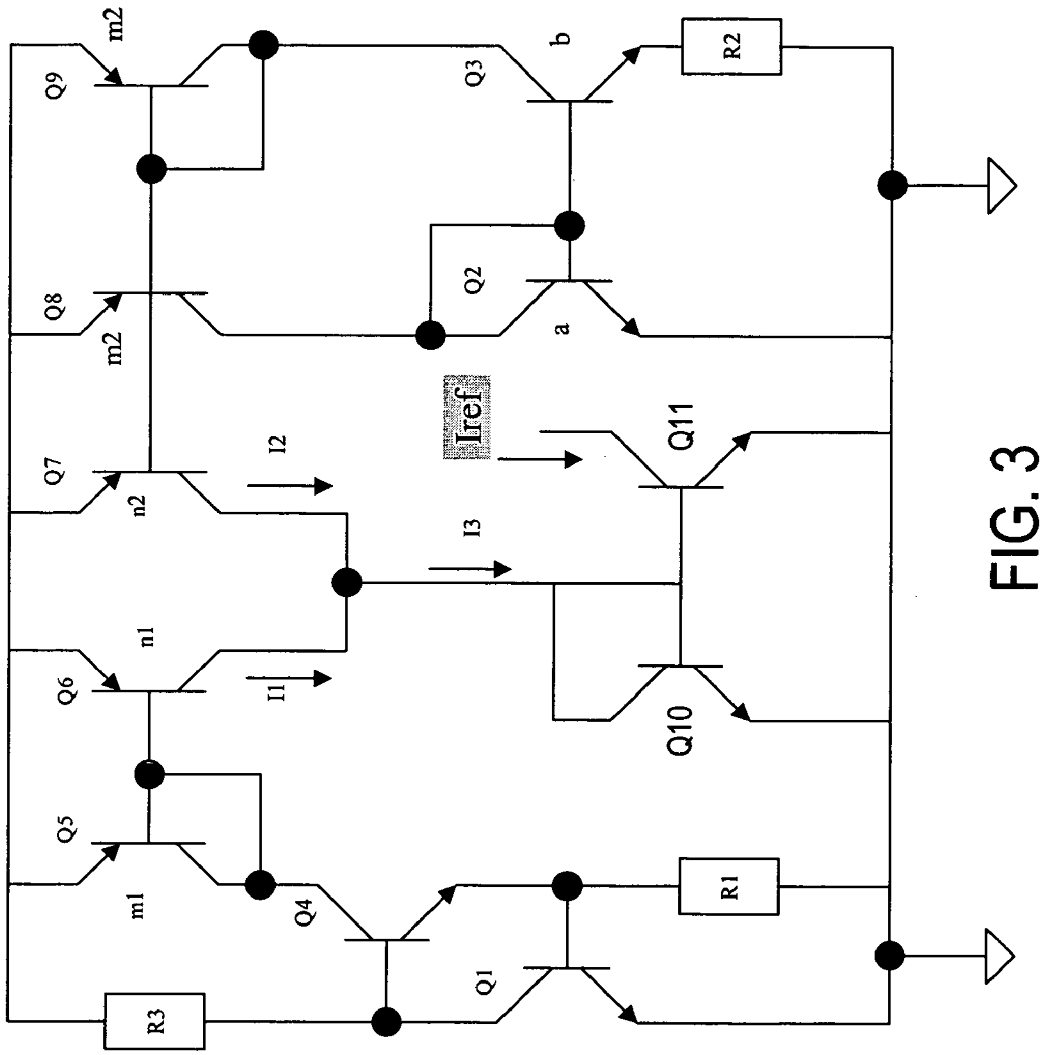
FIG. 3 illustrates an exemplary circuit implementation of the temperature tracking threshold signal generation mechanism of FIG. 2 according to one embodiment of the invention.

FIG. 3 illustrates an exemplary circuit implementation of the temperature tracking threshold signal generation mechanism 150 of FIG. 2 according to one embodiment of the invention. The CTAT current source 210 and the first current mirror 220 are implemented with transistors Q1, Q4, Q5, and Q6 and resistors R1 and R2. It is noted that transistors Q5 and Q6 form the first current mirror 220. The PTAT current source 230 and the second current mirror 240 are implemented with transistors Q2, Q3, Q7, Q8, and Q9 and resistor R2. It is noted that transistors Q7, Q8 and Q9 form the second current mirror 240. Currents I1 and I2 are summed to generated current I3. The third current mirror that is formed by transistors Q10 and Q11 mirrors current I3 to provide reference signal (I_ref).

"m1" denotes emitter size of transistor Q5; "n1" emitter size of transistor Q6; "n2" denotes emitter size of transistor Q7; "m2" denotes emitter size of transistors Q8 & Q9; "a" denotes the emitter size of transistor Q2, and "b" denotes the emitter size of transistor Q3. The current mirror mirrors current I3 to generate a temperature dependent reference signal (e.g., I_ref). It is noted that relationships between the transistors sizes (e.g., a ratio between the transistor sizes) may be determined by the light source temperature coefficient (tempco), the current source temperature coefficient (tempco), and the specific requirements of a particular application.

According to one embodiment, current I1 is determined by the base-to-emitter voltage (V_be) of transistor Q1 and resistor R1, and current I2 is determined by the base-to-emitter voltage (V_be) difference between transistor Q3 and transistor Q4 and resistor R2. In one embodiment, the temperature coefficient of output current I3 may be described by the following expression:

$$(1/I3)(\partial I3/\partial T)=(I1/I3)(1/I1)(\partial 1/I1)+(I2/I3)(1/I2)(\partial I2/\partial T).$$

By utilizing the above expression, one can size the transistors accordingly in order to achieve a predetermined output current temperature coefficient (tempco). Appendix I illustrates exemplary design procedures for generating a temperature dependent reference current (I_ref) by generating currents I1 and I2.

Figure 4:
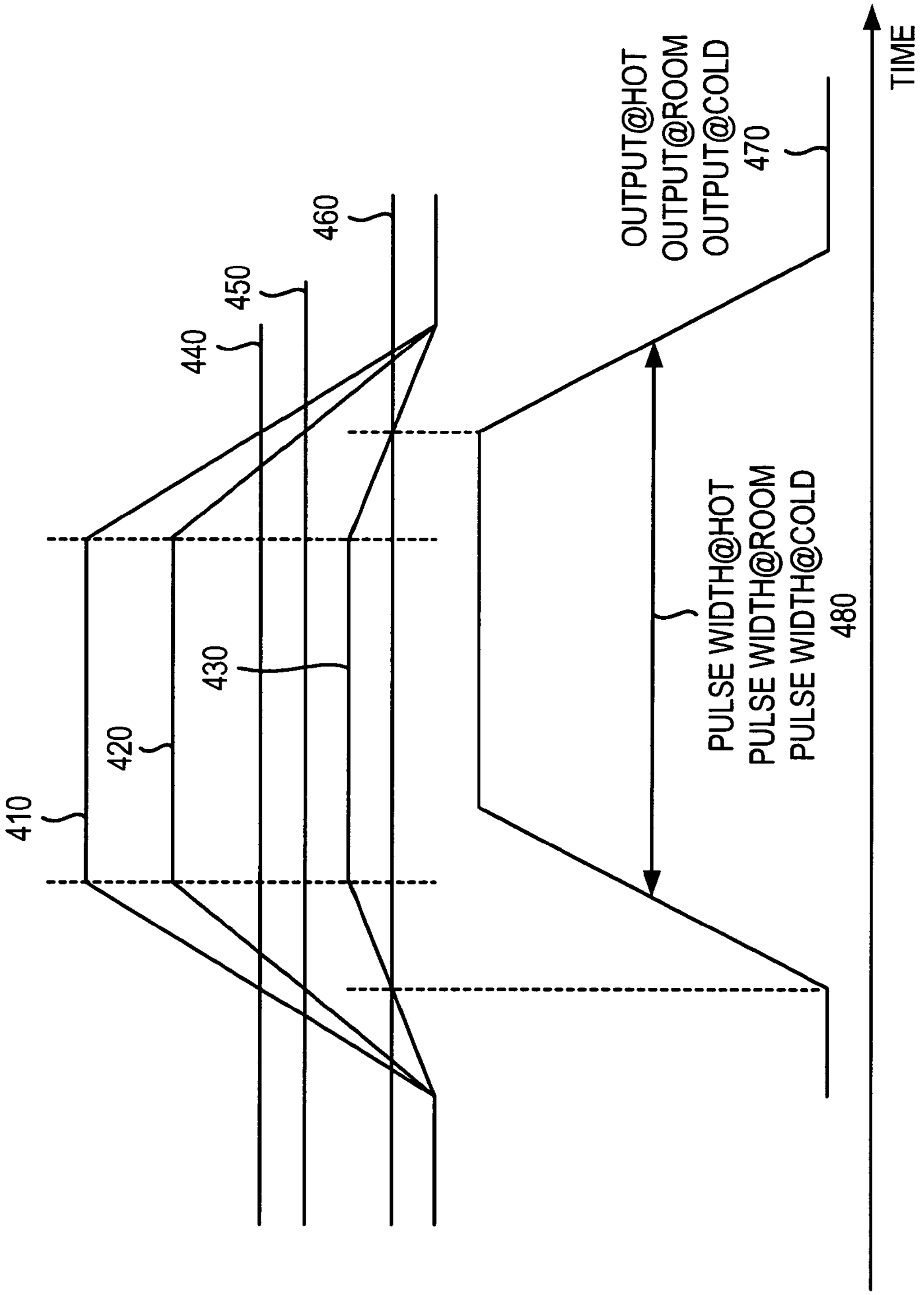
FIG. 4 is a timing diagram that illustrates an output waveform of the light source temperature coefficient tracking current source according to one embodiment of the invention.

FIG. 4 is a timing diagram that illustrates an output waveform of the temperature tracking threshold signal generation mechanism according to one embodiment of the invention. A first waveform 410, a second waveform 420, and a third waveform 430 represent a photodiode current at different temperatures (e.g., cold temperature, room temperature, and hot temperature). An exemplary temperature range is from −40 degrees Celsius to +125 degrees Celsius. For example, the first waveform 410 represents the photodiode current signal at cold temperature (e.g., −40 degrees Celsius). The second waveform 420 represents the photodiode current signal at room temperature. The third waveform 430 represents the photodiode current signal at hot temperature (e.g., +125 degrees Celsius).

A fourth waveform 440, a fifth waveform 450, and a sixth waveform 460 represent reference current signals generated by the temperature tracking threshold signal generation mechanism according to one embodiment of the invention at different operating temperatures. For example, the fourth waveform 440 represents the reference current signal (I_ref@cold) at cold temperature (e.g., −40 degrees Celsius). The fifth waveform 450 represents the reference current signal (I_ref@room) at room temperature. The sixth waveform 460 represents the reference current signal (I_ref@hot) at hot temperature (e.g., +125 degrees Celsius).

It is noted that since the temperature tracking threshold signal generation mechanism provides a different reference signal (e.g., a temperature dependent reference signal) for a corresponding light detection signal (e.g., a photo diode current signal, I_PD), the characteristics of the output voltage signal waveforms (e.g., the pulse width 480, duty cycle, and other traits) may be represented by waveform 470, which does not substantially differ across temperature (e.g., @cold, @room, or @hot). It is further noted that the signal integrity of the output voltage signal is substantially maintained with respect to an input signal (e.g., the light source signal, I_LED).

Figure 5:
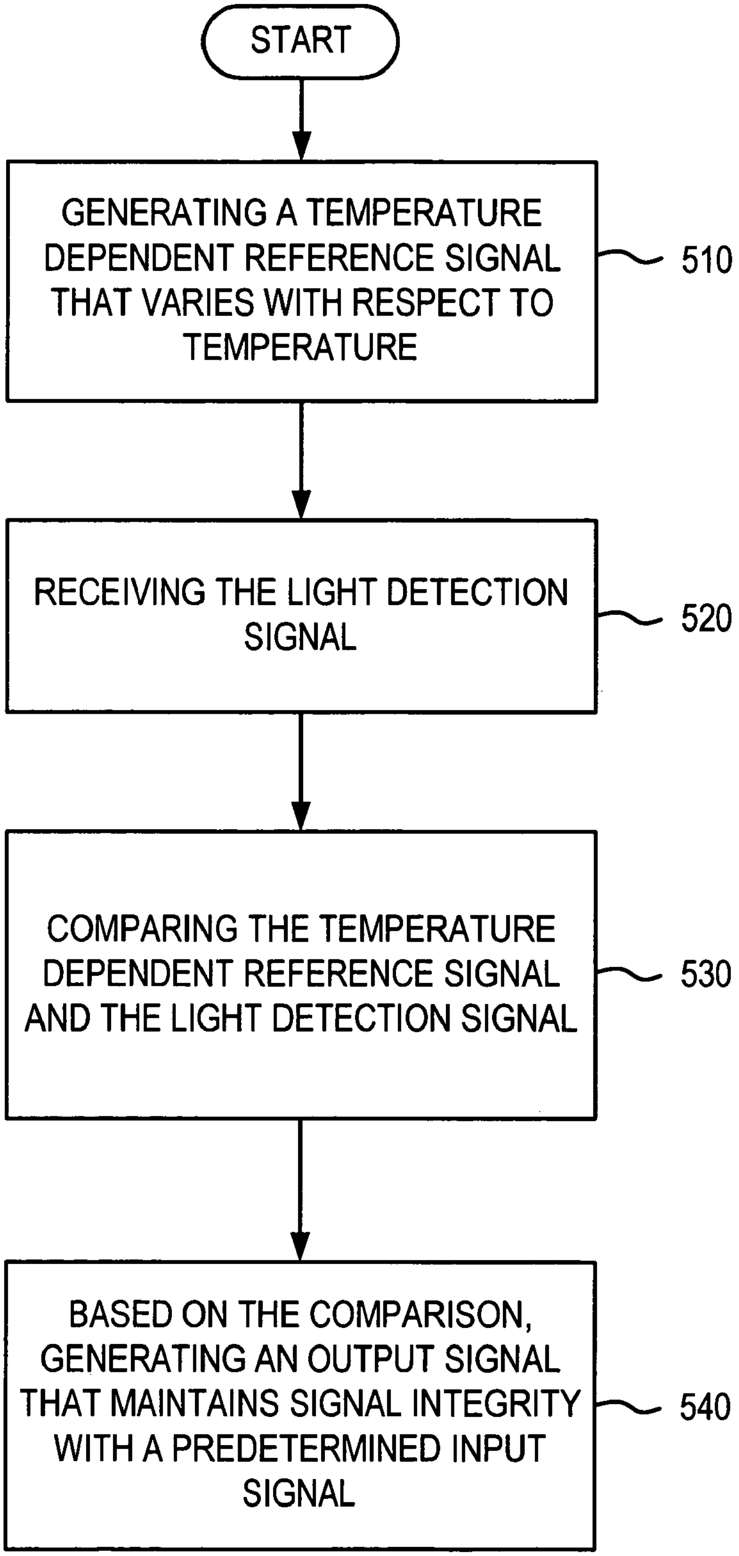
FIG. 5 is a flowchart illustrating a method performed by the temperature tracking threshold generation mechanism according to one embodiment of the invention.
Figure 6:
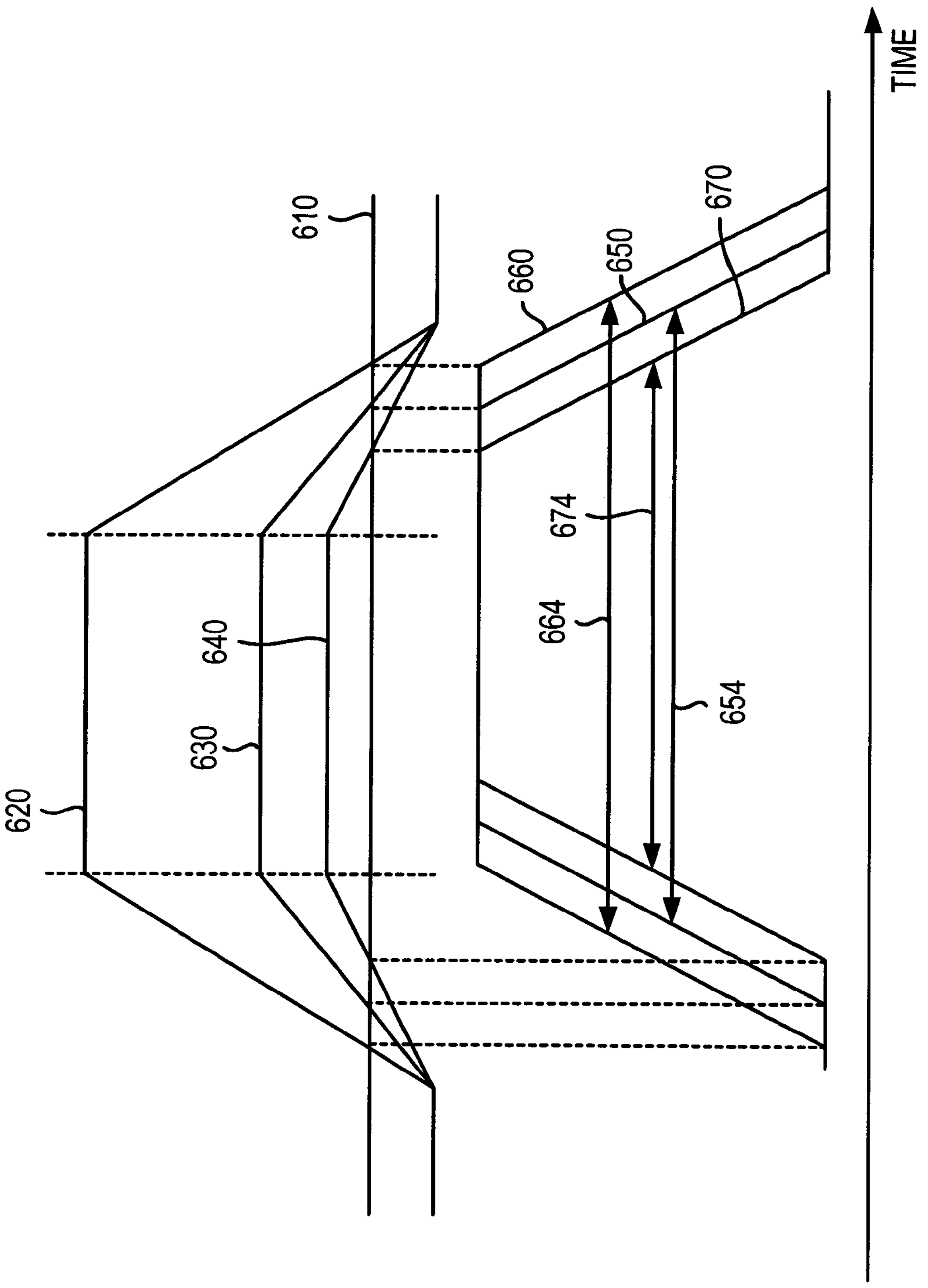
FIG. 6 (PRIOR ART)
FIG. 6 illustrates several waveforms that represent various signals generated by a prior art optocoupler system, where the pulse width of the output voltage signals varies across different temperatures.

Processing Performed by the Temperature Tracking Threshold Generation Mechanism FIG. 5 is a flowchart illustrating a method performed by the temperature tracking threshold generation mechanism according to one embodiment of the invention. In step 510, a temperature dependent reference signal that varies with respect to temperature is generated. Step 510 can include the following steps: 1) generating a first signal that is proportional to absolute temperature; 2) generating a second signal that is complimentary to absolute temperature; and 3) utilizing the first signal and the second signal to generate the temperature dependent reference signal. In one embodiment, the temperature dependent reference signal tracks the temperature coefficient of a light source (e.g., a LED).

In step 520, a light detection signal (e.g., I_LD) is received. In step 530, the temperature dependent reference signal (e.g., I_TDREF) and the light detection signal (e.g., I_LD) are compared. Based on the comparison, an output signal is generated that maintains the signal integrity with a predetermined input signal (e.g., I_LS).

The mechanisms according to the invention are useful in various applications, such as applications or systems where two ground potentials are needed, applications where level shifting is required, other applications that require electrical isolation between a first circuit and a second circuit. For example, an optocoupler system according to the invention may be implemented to provide isolation between a logic circuit (e.g., with standard 5 volt power signal) and an analog control circuit (e.g., a motor control circuit or other industrial application) that operates with higher power signals and perhaps with a floating ground. The mechanisms according to the invention are also useful in applications where isolation is required between a high voltage signal and a human interface (e.g., a logic interface).

It is noted that the mechanisms according to the invention are not limited to the embodiments and applications described above, but instead can be utilized in other applications to reduce turn-on threshold signal variation (e.g., variations in a reference signal) due to changes in operating temperature. Moreover, the mechanisms according to the invention can be utilized in other applications to maintain signal integrity between an input signal (e.g., light source current) and an output signal (e.g., V_out) across temperature variations.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A temperature compensated optically-coupled circuit, comprising:

a current source light detection circuit configured for optical coupling to a light source providing an optical signal of a first pulse width, the light detection circuit further being configured to generate a light detection signal in response thereto, the light detection circuit having a first temperature coefficient associated therewith;

a first operational amplifier circuit configured to receive the light detection signal and provide a first operational amplifier output signal;

a temperature dependent reference current source circuit having a second temperature coefficient associated therewith and configured to generate a temperature dependent reference signal that varies in accordance with the second temperature coefficient;

a second operational amplifier circuit configured to receive the temperature dependent reference signal at a first input thereof and the light detection signal at a second input thereof and provide a second operational amplifier output signal;

a comparator circuit configured to receive the light detection signal and the first operational amplifier output signal as first inputs thereto, and the temperature dependent reference signal and the second operational amplifier output signal as second inputs thereto, the first and second temperature coefficients being substantially the same, the comparator circuit further being configured to provide a comparator output signal having a second pulse width substantially the same as the first pulse width.

2. The temperature compensated optically-coupled circuit of claim 1, wherein the temperature dependent reference current source circuit further comprises at least one of a proportional to absolute temperature (PTAT) circuit and a complementary to absolute temperature (CTAT) circuit.

3. A temperature compensated optically-coupled system, comprising:

a light source signal generation circuit and corresponding light source configured to provide an optical signal of a first pulse width;

a current source light detection circuit configured for optical coupling to the light source and generating a light detection signal in response to the optical signal, the light detection circuit having a first temperature coefficient associated therewith;

a first operational amplifier circuit configured to receive the light detection signal and provide a first operational amplifier output signal;

a temperature dependent reference current source circuit having a second temperature coefficient associated therewith and configured to generate a temperature dependent reference signal that varies in accordance with the second temperature coefficient;

a second operational amplifier circuit configured to receive the temperature dependent reference signal at a first input thereof and the light detection signal at a second input thereof and provide a second operational amplifier output signal;

a comparator circuit configured to receive the light detection signal and the first operational amplifier output signal as first inputs thereto, and the temperature dependent reference signal and the second operational amplifier output signal as second inputs thereto, the first and second temperature coefficients being substantially the same, the comparator circuit further being configured to provide a comparator output signal having a second pulse width substantially the same as the first pulse width.

4. The system of claim 3, wherein the temperature dependent reference current source circuit further comprises a current mirror.

5. The system of claim 3, wherein the temperature dependent reference current source circuit further comprises a proportional to absolute temperature (PTAT) circuit configured to provide a PTAT signal and a complementary to absolute temperature (CTAT) circuit configured to provide a CTAT signal.

6. The system of claim 5, wherein the CTAT circuit further comprises a CTAT current source.

7. The system of claim 6, wherein the CTAT circuit further comprises a current mirror.

8. The system of claim 5, wherein the PTAT circuit further comprises a PTAT current source.

9. The system of claim 8, wherein the PTAT circuit further comprises a current mirror.

10. A method of compensating for temperature-induced signal variations in an optically-coupled circuit comprising:

providing a current source light detection circuit configured for optical coupling to a light source providing an optical signal of a first pulse width, the light detection circuit further being configured to generate a light detection signal in response thereto, the light detection circuit having a first temperature coefficient associated therewith;

providing a first operational amplifier circuit configured to receive the light detection signal and provide a first operational amplifier output signal;

providing a temperature dependent reference current source circuit having a second temperature coefficient associated therewith and configured to generate a temperature dependent reference signal that varies in accordance with the second temperature coefficient;

providing a second operational amplifier circuit configured to receive the temperature dependent reference signal at a first input thereof and the light detection signal at a second input thereof and provide a second operational amplifier output signal;

providing a comparator circuit configured to receive the light detection signal and the first operational amplifier output signal as first inputs thereto, and the temperature dependent reference signal and the second operational amplifier output signal as second inputs thereto, the first and second temperature coefficients being substantially the same, the comparator circuit further being configured to provide a comparator output signal having a second pulse width substantially the same as the first pulse width.

11. The method of claim 10, wherein providing the temperature dependent reference current source circuit further comprises providing a CTAT circuit forming a portion thereof.

12. The method of claim 10, further comprising generating the temperature dependent reference signal with a CTAT circuit forming a portion of the temperature dependent reference circuit.

13. The method of claim 10, wherein providing the temperature dependent reference current source circuit further comprises providing a PTAT circuit forming a portion thereof.

* * * * *